United States Patent [19]

Mermagen et al.

[11] Patent Number: 5,877,516
[45] Date of Patent: Mar. 2, 1999

[54] BONDING OF SILICON CARBIDE DIRECTLY TO A SEMICONDUCTOR SUBSTRATE BY USING SILICON TO SILICON BONDING

[75] Inventors: Timothy Mermagen, Havre de Grace, Md.; Judith McCullen, Buffalo Mills, Pa.; Robert Reams, Silver Springs; Bohdan Dobriansky, Bethesda, both of Md.

[73] Assignee: The United States of America as represented by the Secretary of the Army, Washington, D.C.

[21] Appl. No.: 49,654

[22] Filed: Mar. 20, 1998

[51] Int. Cl.⁶ .................................................. H01L 31/0312
[52] U.S. Cl. .............................. 257/76; 257/77; 257/200; 438/931; 438/973
[58] Field of Search ............................... 257/76, 77, 200; 438/973, 931

[56] References Cited

U.S. PATENT DOCUMENTS

| | | | |
|---|---|---|---|
| 3,389,022 | 6/1968 | Kravitz | 148/174 |
| 3,497,773 | 2/1970 | Kisinko et al | 317/101 |
| 3,920,492 | 11/1975 | Sugita et al. | 148/175 |
| 4,560,589 | 12/1985 | Endou et al. | 427/249 |
| 4,762,806 | 8/1988 | Suzuki et al. | 437/100 |
| 5,049,950 | 9/1991 | Fujii et al. | 357/2 |
| 5,759,908 | 6/1998 | Steckl et al. | 438/479 |

OTHER PUBLICATIONS

Steckl et al, "SiC Silicon–on–Insulator Structures By Direct Carbonization Conversion and Postgrowth From Silacyclobutane", Jun. 1994.

J. Electrochem. Soc., vol. 141, No. 6, Jun., 1994, pp. L66–L68.

*Primary Examiner*—William Mintel
*Attorney, Agent, or Firm*—Paul S. Clohan; Frank J. Dynda

[57] ABSTRACT

A module and a method of making the module is disclosed. The module is formed from a semiconductor substrate and a silicon carbide chip for high temperature applications. The module is designed to be compatible with current silicon IC processes.

3 Claims, 1 Drawing Sheet

BONDING OF SILICON CARBIDE DIRECTLY TO A SEMICONDUCTOR SUBSTRATE BY USING SILICON TO SILICON BONDING

FIELD OF THE INVENTION

This invention pertains to bonding ceramic parts onto silicon substrates for high temperature use. The high temperature process is designed to be compatible with current silicone IC processes. This bonding method and the resultant module have pertinent application in sensing or control circuitry, particularly for development of tank engines, rocket engines and reentry vehicles.

DESCRIPTION OF THE PRIOR ART

High temperature circuits are becoming a reality with the advent of silicone carbide substrates. Recent developments include a circuit that can withstand temperatures of up to 300° C. for short periods of time. These circuits generally comprise silicone carbide transistors, resistive and capacitive elements and metallic interconnects mounted on an aluminum oxide substrate (ceramic). While ceramics can withstand high temperatures, the material used to bond the discrete device to the substrate can not. Subjected to these high temperatures, the bonding material melts, breaks down or degrades. Conventional bonding mediums such as glues and epoxy dies can be cumbersome to use and do not have high temperature durability.

Currently, bonding silicone carbide to a substrate is conducted in a bond and etch back technique for fusing two silicon wafers together, leaving a silicon dioxide layer in between. While this process produces a carbide/substrate module, these cannot hold up to the high temperature applications as our instant invention.

SUMMARY OF THE INVENTION

It is an object of the present invention to provide a process for bonding together a ceramic part to a semiconducter substrate that is capable of withstanding high temperature in its working environment.

It is also an object of the present invention to provide a bonded module or structure of ceramic and semiconducter substrate that is capable of withstanding high temperature in its working environment.

It is yet another object of the present invention to provide a method and structure for bonding semiconductive substrate to a silicone carbide chip which employs known bonding processes that were heretobefore not used for bonding a semiconductor substrate to silicon carbide chips.

It is yet another object of the present invention to provide a bond between a semiconductor substrate and silicon carbide chip that will get stronger when exposed to the high temperatures that the module experiences in its working environment.

DESCRIPTION OF THE PREFERRED EMBODIMENT

Figure 1:
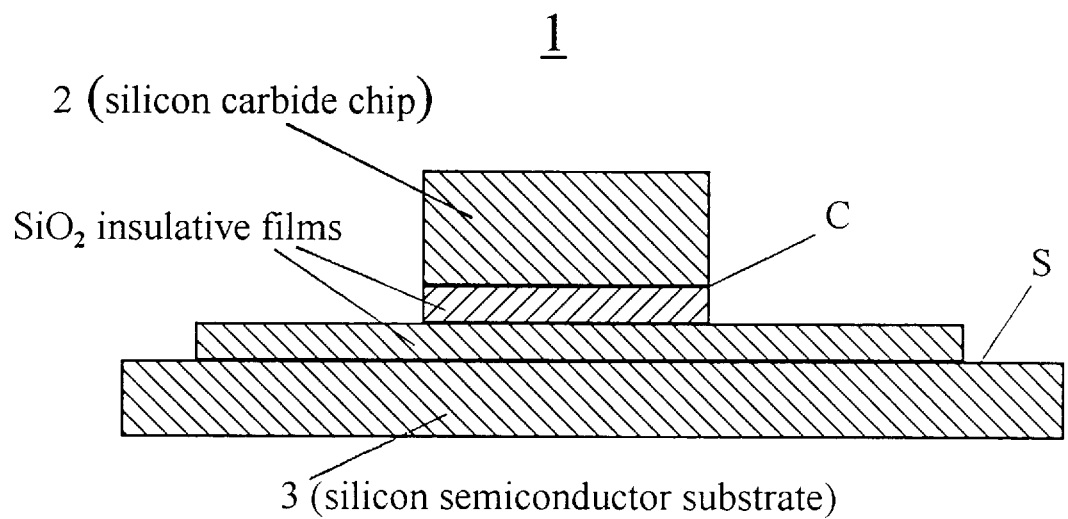
FIG. 1 illustrates a silicon carbide chip placed directly on a semiconductor substrate aligning the crystalline planes.

The invention is directed to a high temperature process for bonding together ceramic parts to a semiconductor substrate which is compatible with current silicon IC processes. The process is more selectively fabricated with silicon carbide circuits on semiconductor substrates and produces modules capable of withstanding temperatures of 600° C. and above, in its functioning environment.

The process describes herein incorporates a silicon carbide chip with circuits on the chip which is fabricated from silicon carbide using known technology. The chip with circuits on the chip is then attached or bonded to a semiconductor substrate and the circuits on the chip are connected to the semiconductive substrate using conductive interconnects (not shown). The special method of attaching the silicon carbide chips to the substrate is achieved by first growing or depositing a film (ie. Silicon dioxide) on the top of the semiconductor substrate and also on the bottom side of the silicon carbide chip. For the example of silicon dioxide the silicon carbide chips are placed on the insulator on the semiconductor substrate and brought up to a desired temperature. At this temperature, the silicon dioxide on the substrate bonds to the silicon dioxide on the chip.

Referring to FIG. 1, modules 1 are fabricated from carbide chip or chips 2 and a semiconductor substrate 3. Carbide chips 2 have a bottom surface 2b having a crystallograph plane C. Substrates 3 have a top surface 3a having a crystallographic plane S. The bottom surface 2b of chips 2 are then attaches or bonded to the top surface 3a of substrate 3 by first aligning the crystallographic plane C of the chips 2 to the crystallographic plane S of the substrate 3 and raising the temperature to the desired temperature so as to bond the semiconductive substrate to the carbide chip thus forming module 1.

The method of attaching carbide chip 2 to substrate 3 includes the steps of (a) aligning crystalline plane C of bottom surface 2b of carbide chip 2 to crystalline plane S of top surface 3a of semiconductive substrate 3 to form module 1; (b) positioning the aligned planes C and S so that top surface 3a of substrate 3 is in physical contact with bottom surface 2b of carbide chip 2; and (c) bonding semiconductive substrate 3 directly to chip 2 by using silicon to silicon bonding and bringing module 1 to a desired temperature.

Uniquely, module 1 experiences stronger bonding between chip 2 and substrate 3 when exposed to high temperatures experienced in its working environment. This novel method is useful for producing multi-chip modules or wafer scale integrated circuits for high temperature applications.

According to the invention, carbide chips 2 may be made of silicon carbide and substrates 3 may be of the <100> orientation 1.3 Ω-cm resistivity n-type silicon wafers.

What is claimed is:

1. A multi-chip module comprising:
   (a) a semiconductor substrate having a top surface comprising a first crystallographic plane, and a first silicon dioxide insulating film deposited thereon;
   (b) a carbide chip having a bottom surface comprising a second crystallographic plane, and a second silicon dioxide insulating film deposited thereon;
   said semiconductor substrate and said carbide chip further positioned so as to align said first crystallographic plane with said second crystallographic plane whereby said first and said second silicon dioxide insulating films are in contact and become bonded to each other by bringing said module up to temperature.

2. The module as recited in claim 1 wherein said semiconductor substrate is a <100> orientation 1.3 Ω-cm n-type silicon wafer.

3. The module as recited in claim 1 wherein said carbide chip is a silicon carbide chip.

* * * * *